THERMOELECTRIC COOLING DEVICES AND METHOD OF MAKING THE SAME

Filed April 18, 1961

INVENTOR.
RALPH EWING JAMISON
BY Frank U. Decker Jr.
ATTORNEY.

United States Patent Office 3,099,137

Patented July 30, 1963

3,099,137

THERMOELECTRIC COOLING DEVICES AND METHOD OF MAKING THE SAME

Ralph Ewing Jamison, Syracuse, N.Y., assignor to Carrier Corporation, Syracuse, N.Y., a corporation of Delaware Filed Apr. 18, 1961, Ser. No. 103,751
11 Claims. (Cl. 62—3)

This invention relates to thermoelectric devices, and, more particularly, to a flexible thermoelectric construction which is adapted to be formed into a garment or other flexible device for utilization in cooling or heating of a localized area.

Thermoelectric cooling of small bodies has well recognized advantages, based in part on simplicity and lack of moving mechanical apparatus. Numerous constructions have been proposed for refrigerating small bodies by utilization of the thermoelectric or Peltier effect. These constructions have generally involved rigid thermoelectric panels, the use of which has been restricted, by their lack of flexibility, to the cooling of rigid areas on defined configurations.

In many instances, it would be desirable to thermoelectrically cool non-rigid bodies or bodies of non-predetermined shape. For example, if a thermoelectric device could be made flexible, it would be possible to form or embed it into a jacket or other garment to be worn by a human being to provide cooling to an industrial worker, such as a crane operator, who must work under conditions of adverse ambient temperatures. Another application for such a device is in the cooling of a pilot's suit. An additional advantage of a thermoelectric cooling device is in the ease with which it may be converted to provide heating by the mere reversal of the polarity of the electric current supplied to it, so that a person may be made comfortable under conditions of varying ambient temperatures. Consequently, a thermoelectric blanket or jacket may be used to provide cooling when the ambient temperature is high and may be automatically thermostatically switched to provide heating should the ambient temperature drop without the need of any attention by the user.

It is the principal object of this invention to provide an improved flexible thermoelectric device.

It is a further object of this invention to provide an improved method of making a flexible thermoelectric device.

These and other objects of this invention are achieved in the illustrated and described embodiment thereof by sintering pellets having different thermoelectric properties to thin flexible metal foil strips having alternate reflective and dark surfaces so that alternate strips are heated and cooled upon the passage of a unidirectional electric current through the pellets. Cloth strips may be interwoven through the thermoelectric device to conduct moisture from the dark face of the cooled strips adjacent the body being conditioned to the dark face of the heated strips away from the conditioned body so as to evaporate the moisture to the atmosphere. A plastic sheet may also be meshed through the thermoelectric device to insulate the heated strips of flexible foil from the body being conditioned and to insulate the cooled strips from the ambient atmosphere. The plastic sheet also serves as a vapor and moisture barrier as well as providing electrical insulation to prevent inadvertent electrical contact between adjacent foil strips.

This construction possesses a particular advantage in cooling a human being because it removes moisture from the body and conveys it to the atmosphere. It is desirable to make provision for disposal of moisture in many thermoelectric cooling devices because of the tendency of the devices to condense moisture from saturated ambient atmosphere being cooled. In human comfort cooling, however, it is particularly advantageous in maintaining the comfort of the person being conditioned and in avoiding a moist or clammy condition from arising in the body region.

These and other objects will become apparent by the following description of a preferred embodiment of the invention and by reference to the attached drawing wherein.

Figure 1:
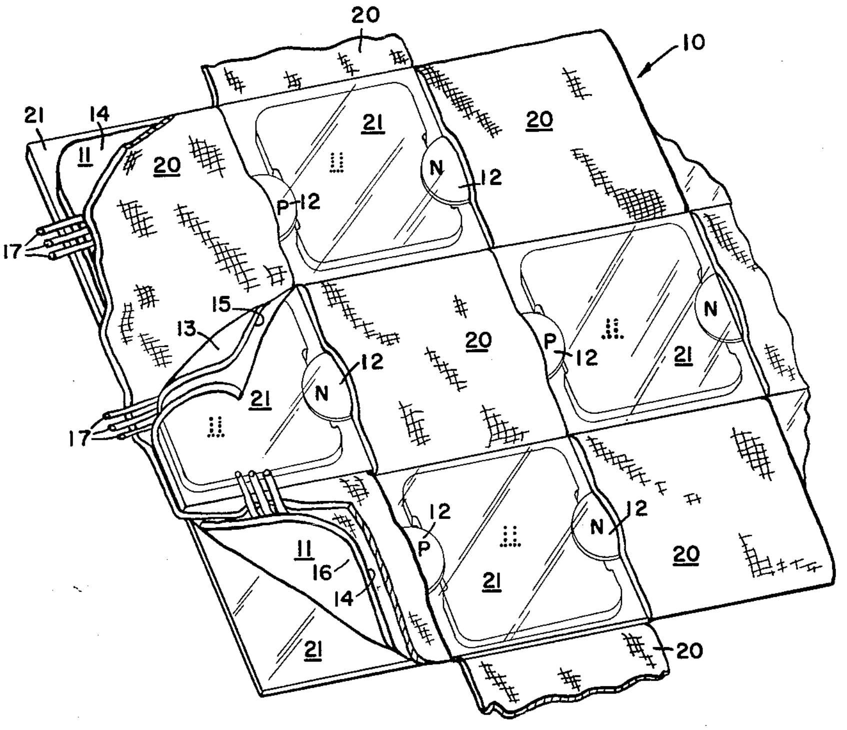
FIGURE 1 is an exaggerated perspective view of a flexible thermoelectric device in accordance with this invention.

Referring to the drawing, there is shown in FIGURE 1 a flexible thermoelectric device 10 such as a garment, blanket or other article adapted for heating or cooling depending on the polarity of the unidirectional current supplied to the device. Device 10 comprises a plurality of thin, flexible, heat conducting, metal foil, strips 11 connected to pellets of semi-conductor or thermoelectric material 12. Strips 11 may desirably be made of aluminum foil. Pellets 12 alternate between pellets of differeing thermoelectric properties connected in series groups by strips 11. For example, one of the pellets 12 may comprise bismuth-telluride-selenide with a suitable doping agent such as cuprous bromide to give it N-type conductivity and the next succeeding pellet in the series may comprise bismuth-antimony-telluride having P-type conductivity. The flexible foil strips comprise conductor straps and form thermoelectric junctions or thermocouples between the adjacent dissimilar thermoelectric pellets or elements.

The flexible foil strips are intimately bonded to the thermoelectric elements and may comprise means to supply electric current to the elements. Since the foil strips are secured to the thermoelectric elements, they also provide heat exchange surfaces and are in heat exchange relation to the thermoelectric elements. Consequently, when a unidirectional electric current is passed through the pellets and flexible foil strips, the strips will alternate between heated and cooled strips in the series. Strips 11 may comprise single foil members, as shown, or may be folded, U-shaped, multilayered members if desired.

In FIGURE 1, there is shown for purposes of illustration three groups of generally horizontally extending series connected foil strips arranged so that a cooled strip in the center of the matrix is adjacent heated strips on each of its four sides forming a checkered pattern of heated and cooled foil strips. It will be understood that if current is passed through the foil strips in the opposite direction, that the relationship of heated and cooled strips will be reversed so that the center strip in the matrix shown, would be heated and its adjacent strips cooled. It will be appreciated that all of the foil strips and thermoelectric elements may be connected in series to form alternately heated and cooled strips or various series and parallel combinations of groups may be devised to achieve the same effect. Also, any desired number of thermoelectric junctions may be employed to provide adequate heating or cooling for a particular purpose. The checkered arrangement of heated and cooled strips shown is desirable but not essential to the desired result and, alternatively, heated strips may be adjacent other heated strips and cooled strips may be adjacent other cooled strips, if desired.

In order to assure that one side of the thermoelectric device will be generally cooler than the other side, side 14 of the cooled foil strips may be darkened by appropriate means, to be subsequently described, in order to provide a surface thereon of relatively high thermal absorptivity. The opposite side 16 of cooled strip 11 is shiny in order to provide a surface of relatively high reflectivity. The high thermal absorptivity surface 14 is located adjacent the body to be cooled, whereas the high reflectivity surface 16 is on the opposite side located away from the body to be cooled. Thermally absorptive surface 14 will therefore absorb heat from the body and reflective surface 16 will reflect heat from the ambient atmosphere rather than absorbing it.

In addition, faces 15 of the heated strips 11, which are adjacent the body to be cooled, are shiny so as to have relatively high reflectivity and the opposite sides 13 of the strips to be heated are darkened in order to provide a surface having relatively high emissivity. Consequently, surface 15 of the strips to be heated will radiate relatively less heat to the body to be cooled than is radiated to the ambient atmosphere by the opposite high emissivity surface 13.

In order to conduct moisture which may be condensed on the cold side of thermoelectric device 10 to the atmosphere, strips of fibrous, cotton fabric or cloth 20 or other wick-like material are interwoven through the device. Cloth 20 is preferably a dark material and overlies the high absorptivity surface 14 of the cooled foil strips adapted to be positioned adjacent the body to be cooled, and passes under the transversely adjacent heated foil strips so as to be in contact with and overlie their opposite high emissivity surfaces 13 adapted to be positioned away from the body to be conditioned. Moisture which is condensed by or absorbed on the high absorptivity face of the cooled strips is therefore conducted through the fibers of the cloth by capillary action to the high emissivity surface on the correspondingly opposite side of the adjacent heated foil strips where it is evaporated to the ambient atmosphere. This is particularly advantageous in removing moisture from a jacket or other article of human clothing to prevent its accumulation next to the human being.

In order to prevent salt laden moisture or other conductive fluids from short circuiting the elements of thermoelectric device 10 and to inhibit heat flow to or from the heated and cooled foil strips 11 in an undesired direction, a plastic sheet 21 is formed over the reflective surfaces of the strips to be heated and cooled. This plastic sheet is therefore formed over the high reflectivity surface of the foil strips to be cooled and over the correspondingly opposite high reflectivity surface foil strips to be heated. The plastic employed is preferably a low heat conducting moisture impervious polyethylene or polyester film. For purposes of clarity in the drawing, the plastic sheet has been shown to be a transparent film; it will be understood that this feature may be desirable but not absolutely essential.

Since the thin flexible metal strips 11 may have a relatively low tensile strength, it is desirable to provide suitable reinforcing means so that an axial pull on the series of thermoelectric elements does not injure the assembly. In FIGURE 1, there is shown reinforcing means 17 comprising a plurality of copper wires which may be solder bonded both to foil strips 11 and to thermoelectric elements 12 in a manner which will presently be described. Metal reinforcing wires provide the additional advantage of improving thermal and electrical conductivity through the completed assembly and reduce resistive heating of the cooled foil strips.

After completion of the thermoelectric device shown in FIGURE 1, having the desired number of thermoelectric junctions and the desired area, the entire device may be formed into a fabric jacket, blanket or other device to better serve its intended function. Because of the flexibility imparted to the assembly by the foil strips, the resulting article also may be pliable and flexible and may be made to conform closely to the body to be cooled. The reinforcing means better enables the garment to withstand stresses due to flexure of the device when worn as a jacket or other covering.

Figure 2:
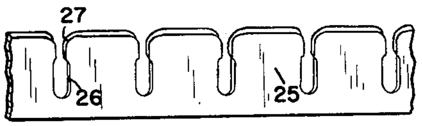
FIGURES 2–7 illustrate steps in the method of making a thermoelectric device in accordance with this invention.

FIGURE 2 shows the first step in a method of manufacture of the article heretofore described. A sheet of foil 25 is notched to form appropriate slots or notches 26 corresponding to the number of junctions desired in a group and extending toward one edge of the foil sheet. It may be preferable to round corners 27 of slots 26 in order to help avoid contact between the adjacent segments of foil when the resulting article is flexed or twisted. Notches 26 are made sufficiently narrow to be secured to the thermoelectric pellets while at the same time being sufficiently wide to afford the desired temperature differential across the pellets in the resulting assembly. Foil sheet 25 is of a relatively thin, flexible, good heat conducting material, such as copper or aluminum, preferably having a high heat reflectivity surface.

Figure 3:
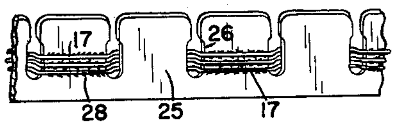
Figure 4:
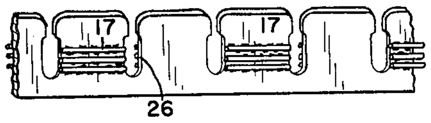

Reinforcing means comprising wire 17 is inserted through slots 26 as shown in FIGURE 3. The reinforcing material is desirably copper or aluminum wire. The wire reinforcement and adjacent foil strips may then be bonded by a suitable solder 28 to each other utilizing ultrasonic fluxing if desired. After the wire reinforcement has been bonded to the metal foil, the portions of the reinforcement wire in notches 26 are removed as shown in FIGURE 4.

Figures 5, 7:
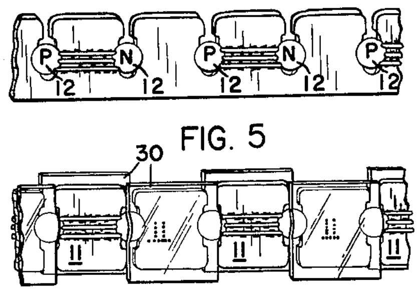
Figure 6:
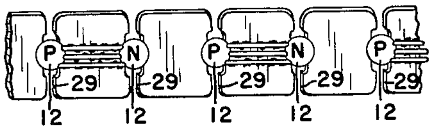

Thermoelectric pellets 12 are then secured to the metal foil as shown in FIGURE 5. Preferably, a quantity of powdered thermoelectric material may be placed in an appropriate mold located in the region of notches 26 and sintered in situ to connect the foil to the thermoelectric pellets or elements as they are formed. Alternatively, the thermoelectric elements may be cast into notches 26 or the elements may be preformed in any desired manner and soldered to foil strips 12. In either case, it may be desirable to tin the portion of the foil strip which is to be bonded to the thermoelectric material to facilitate formation of a good junction. It will be understood that the thermoelectric elements alternate between those having P-type conductivity and those having N-type conductivity in order to provide successively heated and cooled foil strips. The thermoelectric elements are connected both to the metal foil and to the reinforcing wire so that the reinforcing wire serves to provide an electrically conducting path in addition to the foil for current to flow through the thermoelectric elements. The ends of the reinforcing wire may project from the last thermoelectric elements in the series group to allow connection of the group in series or parallel to adjacent series groups of thermoelectric elements, as desired, and to a suitable source of unidirectional current such as a rectifier or battery. Notches 29 having rounded corners, as shown in FIGURE 6, are then punched out of a foil sheet to form separate foil segments 11 connecting the thermoelectric elements.

Small sheets of a suitable relatively impervious, non-electrically conducting thermally insulating, transparent, plastic material 30 such as a polyester or a polyethylene film is then disposed on alternatingly opposite, reflective, surfaces of foil strips 11 as shown in FIGURE 7. The edges of the plastic material preferably overlap the edges of foil segments 11 and may then be cemented or heat bonded to each other at their contacting edges to form a continuous impervious sheet 21 as shown in FIGURE 1. This sheet extends from one reflecting surface 15 of a segment 11 through slots 27 and 29 to the correspondingly opposite reflecting surface 16 of the next foil strip in the series so as to form a substantially continuous impervious plastic sheet 21.

As previously mentioned, the surfaces of foil segments 11 which are exposed and not covered by plastic sheet 21 are blackened or otherwise darkened so as to be heat absorptive and heat emitting. This may be done at the same time as the interweaving of cloth strips 20 by securing the cloth to the foil strips by means of a dark cement or adhesive such as methyl ethyl ketone having a quantity of carbon black therein. Care must be taken to prevent saturating the cloth or other wick material with adhesive so that its capillary nature is retained. Preferably, the cement is applied to the strips, allowed to become tacky and the cloth is then pressed into the tacky adhesive. When the foil strips are arranged in a checkered pattern of heated and cooled sections as shown in FIGURE 1, the cloth strips may pass under and over transversely adjacent opposite faces of foil strips 11 and be bonded thereto. If the bonding agent contains carbon black the desired surfaces 13 and 14 are simultaneously darkened and rendered thermally absorptive or emissive; however, other suitable darkening means may be employed to render the desired surfaces emissive or absorptive if desired.

Any number of thermoelectric elements or groups may be assembled in the manner herein illustrated and described to form a thermoelectric device of desired size, shape, and cooling or heating capacity. As has been previously noted, the series groups of thermoelectric elements can be connected by means of reinforcing wires 17 in any desired series or parallel combinations and connected to a suitable source of unidirectional current for operation.

It will be understood that a preferred embodiment of this invention has been described and that various modifications thereto are contemplated within the scope of the following claims.

I claim:

1. A flexible thermoelectric assembly comprising a plurality of thermoelectric elements having dissimilar thermoelectric properties; said thermoelectric elements being joined in series by a plurality of thin flexible metal foil strips to provide alternate heated and cooled thermoelectric junctions and corresponding foil strips upon the passage through said thermoelectric elements of a unidirectional current having a predetermined polarity; the cooled foil strips connecting thermoelectric junctions of the type adapted to be cooled and having a relatively high thermal absorptivity surface on one side thereof corresponding to one side of said flexible thermoelectric assembly, and having a relatively high thermal reflectivity surface on the other side thereof corresponding to the opposite side of said thermoelectric assembly; the heated foil strips connecting thermoelectric junctions of the type adapted to be heated and having a relatively high thermal reflectivity surface on the side thereof corresponding to said one side of said thermoelectric assembly, and having a relatively high thermal emissivity surface on the other side thereof corresponding to the opposite side of said thermoelectric assembly so as to minimize heat transfer from the opposite side of said thermoelectric assembly to said one side of said thermoelectric assembly.

2. A flexible thermoelectric couple for heating or cooling of a desired region comprising a pair of thermoelectric elements of dissimilar thermoelectric material; a relatively thin, flexible, heat conducting metal foil strip connecting said thermoelectric elements and being in heat exchange relation therewith; and reinforcing means having a higher tensile strength than said thin flexible foil strip, secured to said thermoelectric elements and extending therebetween to add tensile strength to said thermoelectric couple.

3. A flexible thermoelectric couple for heating or cooling of a desired region comprising a pair of thermoelectric elements of dissimilar thermoelectric material; a relatively thin, flexible, heat conducting metal foil strip connecting said thermoelectric elements and being in heat exchange relation therewith; reinforcing means having a higher tensile strength than said thin flexible foil strip, secured to said thermoelectric elements and extending therebetween to add tensile strength to said thermoelectric couple, said reinforcing means comprising an electrically conducting wire member adapted to pass a unidirectional current through said thermoelectric elements to provide heating or cooling of said flexible foil strip.

4. A flexible thermoelectric construction for heating or cooling of a body comprising a plurality of thermoelectric elements of dissimilar thermoelectric properties; a plurality of relatively thin, flexible, heat conducting, metal foil strips; said flexible foil strips connecting said thermoelectric elements in alternating series relation to form a plurality of groups of series connected dissimilar thermoelectric elements through which a unidirectional current may be passed in a predetermined direction to alternately heat and cool successive foil strips, said groups of foil strips being disposed adjacent each other; a relatively impervious plastic sheet extending over one face of the flexible foil strips adapted to be cooled, and across the correspondingly opposite other face of the flexible foil strips adapted to be heated; a fibrous fabric material extending over the other face of the flexible foil strips adapted to be cooled and across the correspondingly opposite one face of the flexible foil strips adapted to be heated.

5. A thermoelectric device as defined in claim 1 further including a relatively thin flexible plastic sheet extending over the high reflectivity surface of the heated flexible foil strips and over the high reflectivity surfaces of the cooled flexible foil strips.

6. A thermoelectric device as defined in claim 4 wherein the cooled foil strips in each group are disposed adjacent heated foil strips in the adjacent groups to form a checkered pattern of heated and cooled foil strips.

7. A thermoelectric device adapted for use in cooling a body comprising in combination, a plurality of thermoelectric elements having dissimilar thermoelectric properties, said thermoelectric elements being connected by relatively thin flexible heat conducting metal foil strips, said metal foil strips being arranged in a plurality of groups each successively coupling thermoelectric elements of dissimilar thermoelectric properties in series so that when a unidirectional electric current is passed through said thermoelectric elements the current serves to alternately heat and cool successive foil strips, the cooled foil strips having a high absorptivity surface on the face thereof adapted to be placed adjacent the body to be cooled and having a high reflectivity surface on the face thereof opposite said high absorptivity surface, the heated foil strips having a high reflectivity surface on the face thereof adapted to be placed adjacent the body to be cooled and having a high emissivity surface on the face opposite said high reflectivity surface, said plurality of groups of foil strips being disposed in parallel relation with respect to each other, and an absorptive fibrous wick material, said wick material being in contact with the high absorptivity surface of a foil strip adapted to be cooled and extending over the high emissivity surface of an adjacent foil strip adapted to be heated to absorb moisture condensed on the cooled foil strip and pass said moisture to the heated foil strip for evaporation and dissipation thereof from said body.

8. A thermoelectric device adapted for use in cooling a body comprising in combination, a plurality of thermoelectric elements having dissimilar thermoelectric properties, said thermoelectric elements being connected by relatively thin flexible heat conducting metal foil strips, said metal foil strips being arranged in a plurality of groups each successively coupling thermoelectric elements of dissimilar thermoelectric properties in series so that when a unidirectional electric current is passed through said thermoelectric elements the current serves to alternately heat and cool successive foil strips, the cooled foil strips having a high absorptivity surface on the face thereof adapted to be placed adjacent the body to be cooled and having a high reflectivity surface on the face thereof opposite said high absorptivity surface, the heated foil strips having a high reflectivity surface on the face thereof adapted to be placed adjacent the body to be cooled and having a high emissivity surface on the face thereof opposite said high reflectivity surface, said plurality of rows of foil strips being disposed in parallel relation with respect to each other, the cooled foil strips in each group being adjacent heated foil strips in the adjacent groups to form a checkered pattern of heated and cooled foil strips, an absorptive fibrous wick material, said wick material being in contact with the high absorptivity surface of a foil strip adapted to be cooled and extending over the correspondingly opposite high emissivity surface of an adjacent foil strip adapted to be heated to absorb moisture condensed on the cooled foil strip and pass said moisture to the opposite face of a heated foil strip for evaporation and dissipation thereof from said body, and a relatively impervious plastic sheet, said plastic sheet extending over the high reflectivity surface of the heated foil strips and over the high reflectivity surface of the cooled foil strips.

9. A flexible garmet having embedded therein a thermoelectric heating and cooling construction adapted to provide heating or cooling of the wearer of the garment comprising a plurality of pellets of semi-conductor material, said pellets being of at least two types having dissimilar thermoelectric properties, a plurality of flexible heat conducting relatively thin metal foil strips connecting pairs of said pellets having differing thermoelectric properties in series relation to provide a plurality of foil strips adapted to be heated and a plurality of foil strips adapted to be cooled upon the passage therethrough of a unidirectional current in a predetermined direction, said thin metal foil strips being intimately bonded to said thermoelectric pellets to form heat transfer surfaces therewith, said garment remaining pliable due to the flexibility of said foil strips.

10. A flexible garment as defined in claim 9 including reinforcing means extending between said thermoelectric pellets and bonded thereto, said reinforcing means having a greater tensile strength than said relatively thin metal foil strips and serving to increase the tensile strength of said thermoelectric construction so that said garment is adapted to withstand stresses due to flexure.

11. A garment adapted to provide temperature conditioning of a human being, comprising a plurality of thin flexible metal foil strips connecting dissimilar thermoelectric elements forming a plurality of foil strips adapted to be cooled and a plurality of foil strips adapted to be heated on the passage through said thermoelectric elements of a unidirectional electric current in a predetermined direction; a wick material interwoven with said foil strips, said wick material overlying a face of a cooled foil strip adapted to be positioned adjacent the user of said garment, and extending to a heated strip and overlying a face thereof adapted to be positioned away from the user, so as to conduct moisture from the cooled strip adjacent the user to the heated strip for evaporation to the ambient atmosphere.

References Cited in the file of this patent

UNITED STATES PATENTS

| | | |
|---|---|---|
| 2,871,549 | Arnold | Feb. 3, 1959 |
| 2,887,763 | Snavely | May 26, 1959 |
| 2,938,356 | McMahon | May 31, 1960 |
| 2,991,627 | Suits | July 11, 1961 |